United States Patent [19]

Shiralagi

[11] Patent Number: 5,733,817
[45] Date of Patent: Mar. 31, 1998

[54] BLANKET OXIDATION FOR CONTACT ISOLATION

[75] Inventor: Kumar Shiralagi, Chandler, Ariz.

[73] Assignee: Motorola, Inc., Schaumburg, Ill.

[21] Appl. No.: 879,380

[22] Filed: Jun. 20, 1997

[51] Int. Cl.[6] .................. H01L 21/283; H01L 21/316
[52] U.S. Cl. .................. 438/597; 438/620; 438/688; 438/768
[58] Field of Search .................. 438/595, 597, 438/604, 618, 620, 688, 765, 767, 768, 785, 363, 422

[56] References Cited

U.S. PATENT DOCUMENTS

| | | | |
|---|---|---|---|
| 4,496,419 | 1/1985 | Nulman et al. | 438/669 |
| 4,716,131 | 12/1987 | Okazawa et al. | 438/586 |
| 5,206,187 | 4/1993 | Doan et al. | 438/618 |
| 5,624,874 | 4/1997 | Lim et al. | 438/768 |

*Primary Examiner*—T. N. Quach
*Attorney, Agent, or Firm*—Eugene A. Parsons

[57] ABSTRACT

A method of forming isolated metal contacts during fabrication of semiconductor devices including blanket forming contact metal on a semiconductor device having a mesa structure with a first layer overlying an upper surface, a second layer overlying a lower surface and a third, substantially thinner layer overlying the sidewall therebetween. The contact metal is blanket oxidized using deep ultra violet light until the third layer is substantially completely oxidized thereby electrically isolating the first layer from the second layer.

16 Claims, 1 Drawing Sheet

BLANKET OXIDATION FOR CONTACT ISOLATION

FIELD OF THE INVENTION

The present invention pertains to the fabrication of semiconductor devices and more specifically to improved methods of forming contact metal during semiconductor device fabrication.

BACKGROUND OF THE INVENTION

In the semiconductor field it is common to place contact metal on semiconductor device by evaporation. In semiconductor devices having a mesa structure, a metal contact is generally placed at the top and bottom of the mesa. Typically, contact isolation is required between the top and bottom of the mesa. Isolating contacts can be difficult and time consuming, and is commonly achieved through multiple evaporations. Even when the mesa walls are near vertical, a small amount of metal can be deposited on the sidewalls. This small amount of deposited metal is sufficient to act as a short between top and bottom contact metal.

Therefore, to prevent the formation of shorts, conventional lithographic techniques are employed to define top and bottom contact regions. A plurality of steps are required, including forming a mask using lithographic techniques. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

In addition to the etching problems, the lithographic processes require many interspersed growing, masking and etching steps which greatly complicate and lengthen the process. For example, when metal is deposited, the wafers must be placed in a processing chamber. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide a single step process for forming metal contacts on the top and bottom of a mesa.

It is a purpose of the present invention to provide a method for forming metal contacts on the top and bottom of a mesa without the use of lithography.

It is another purpose of the present invention to provide a method for forming metal contacts on the top and bottom of a mesa during the fabrication of semiconductor devices which does not require removal of the substrate from the processing chamber.

It is a further purpose of the present invention to provide a method for forming metal contacts on the top and bottom of a mesa during the fabrication of semiconductor devices which is much simpler and includes less chance of contamination of the devices.

SUMMARY OF THE INVENTION

The above problems and others are at least partially solved and the above purposes and others are realized in a method of forming isolated metal contacts during fabrication of semiconductor devices including blanket forming contact metal on a semiconductor device having a mesa structure with a first layer overlying an upper surface, a second layer overlying a lower surface and a third, substantially thinner layer overlying the sidewall therebetween. The contact metal is blanket oxidized using deep ultra violet light until the third layer is substantially completely oxidized thereby electrically isolating the first layer from the second layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
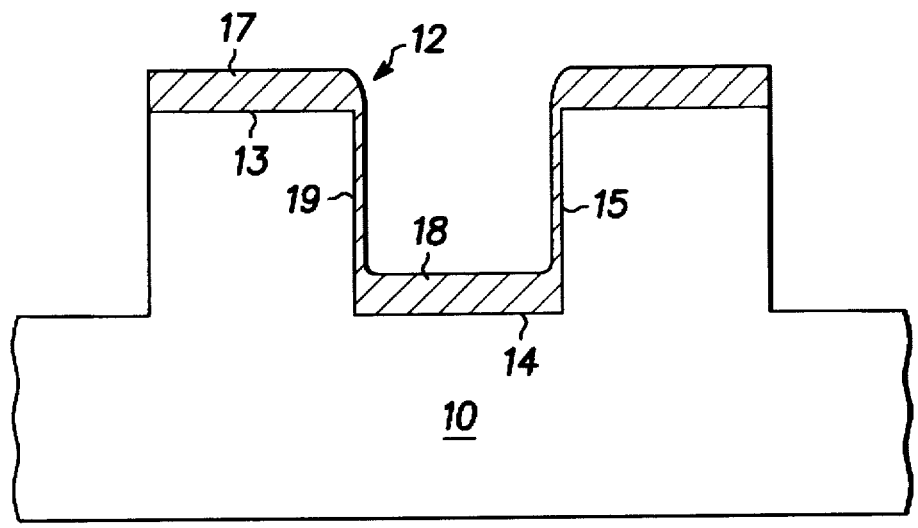
FIG. 1 is a simplified sectional view of a mesa structure of a semiconductor device with contact metal formed thereon in accordance with the present invention.

Turning now to the drawings in which like reference characters indicate corresponding elements throughout the several views, attention is directed to FIG. 1 which illustrates a semiconductor device 10 having a mesa structure 12. Semiconductor device 10 is not illustrated in detail, other than including mesa structure 12 having an upper surface 13, a lower surface 14, and a sidewall 15 extending therebetween in a substantially upright orientation. Other details are not included as they are not relevant to the present invention. However, it will be understood that semiconductor device 10 can include a great many various structures and layers used in semiconductor devices well known to those skilled in the art and employed with a mesa structure, such as FETs.

Many semiconductor devices require metal contacts which are isolated from one another, such as in gate, source and drain, etc. In the present embodiment, contact metal is blanket deposited over the entire mesa structure forming a layer 17 overlying upper surface 13, a layer 18 overlying lower surface 14 and a layer 19 overlying sidewall 15. This process is preferably performed in a single step by evaporation. As will be readily understood, layers 17 and 18 will be substantially uniform and have a thickness of approximately 1000 Å. It will also be understood that layers 17 and 18 may be thinner or thicker as required to provide a good contact. Layer 19 will be substantially thinner than layers 17 and 18, as sidewall 15 is substantially upright between surfaces 13 and 14. Because sidewall 15 is upright, less contact material is deposited thereon. Some contact metal will deposit on sidewall 15 even when near vertical. Layer 19 is preferably in the range of approximately 10–20 Å thick.

The contact metal used is selected from III–V materials. In this specific embodiment, aluminum is employed as the contact metal. III–V material such as aluminum is employed because it has been found to oxidize under deep ultra violet radiation in the presence of oxygen. Oxygen may be supplied in a pure form or air such as the ambient atmosphere.

Figure 2:
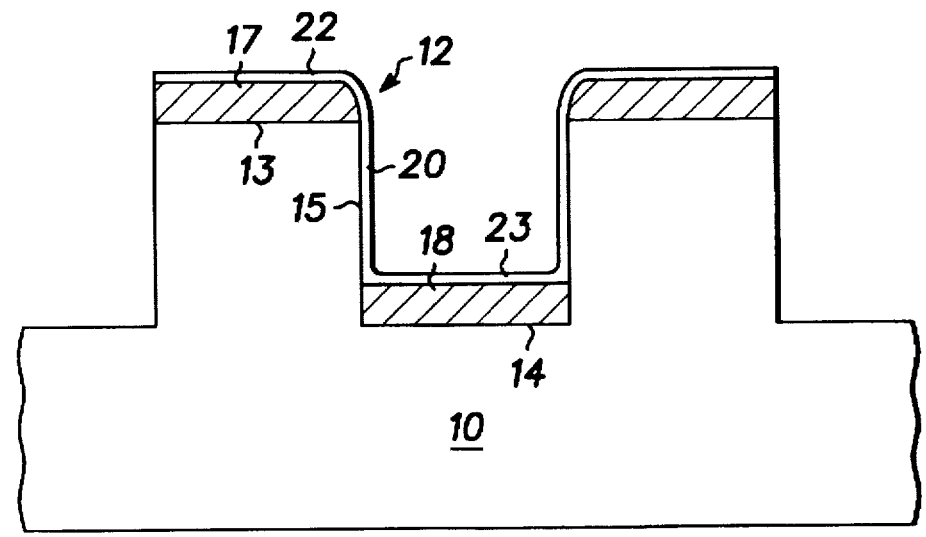
FIG. 2 is a simplified sectional view of the mesa structure of FIG. 1 with electrically isolated contacts.

Turning now to FIG. 2, in a preferred embodiment semiconductor device 10 and mesa structure 12 are exposed to an ultraviolet source in ambient conditions (air), i.e. no special chamber, etc., to expose the contact metal (aluminum) to a combination of ultraviolet rays and ozone. The UV-ozone process grows a dense layer of oxide on III–V material such as aluminum by converting the aluminum to aluminum oxide. The term "deep ultraviolet" refers to light in the ultraviolet range, generally with a wavelength in the range of 180 to 250 nanometers. In the present specific example, it is believed that the 185 nm light generates ozone due to optical excitation. Therefore, excitation wavelength that is most suitable for efficient ozone generation is also the most efficient to use, although virtually any ultraviolet light will produce the desired result. The exposure to light can be performed in an aligner or stepper to define sharp features or, as in the present embodiment, performed under a lamp to provide a blanket oxidation of the III–V material.

Because blanket oxidation is used, the contact metal of layers 17, 18 and 19 will oxidize at a substantially uniform rate. Since layer 19 is substantially thinner than layers 17 and 18, it can be substantially entirely converted into an insulator layer 20, such as aluminum oxide, while leaving the majority of layers 17 and 18 in the original form with a thin layer 22 and 23 of oxide formed thereon. Thus, layers 17 and 18 are effectively isolated from each other by aluminum oxide layer 20, an insulator. It has been found that not only are the contacts isolated, but device performance is also enhanced. For example, the UV oxide could oxidize the top surface of GaAs, particularly in the gate region of a FET, and reduce leakage current. This happens by the growth of the oxide as $Ga_2O_3$ and the resultant tying of the dangling bonds on the surface. If the surface layer contains carbon, the surface oxidation process will prevent leakage current or other effects that might hurt device performance.

Thus, a single step process for forming isolated metal contacts on an upper surface and a lower surface of a mesa is provided. The method of forming metal contacts on the upper surface and lower surface of a mesa during the fabrication of semiconductor devices does not use of lithography and also does not require removal of the substrate from the processing chamber. Thus a much simpler method for forming metal contacts on the top and bottom of a mesa during the fabrication of semiconductor devices is provided, and one which includes less chance of contamination of the devices.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of forming isolated metal contacts during fabrication of semiconductor devices comprising the steps of:

providing a mesa structure of a semiconductor device having an upper surface, a lower surface and an upright sidewall extending between the upper surface and the lower surface;

blanket forming contact metal on the semiconductor device with a first layer overlying the upper surface, a second layer overlying the lower surface and a third layer overlying the sidewall, the third layer being substantially thinner than the first layer and the second layer; and blanket oxidizing the contact metal until the third layer overlying the sidewall is substantially completely oxidized thereby electrically isolating the first layer from the second layer.

2. A method of forming isolated metal contacts during fabrication of semiconductor devices as claimed in claim 1 wherein the step of blanket forming contact metal includes evaporation deposition.

3. A method of forming isolated metal contacts during fabrication of semiconductor devices as claimed in claim 1 wherein the step of blanket oxidizing includes exposing the contact metal to deep ultra violet light in the presence of oxygen or ozone.

4. A method of forming isolated metal contacts during fabrication of semiconductor devices as claimed in claim 1 wherein the contact element includes a III–V material.

5. A method of forming isolated metal contacts during fabrication of semiconductor devices as claimed in claim 4 wherein the blanket material includes aluminum.

6. A method of forming isolated metal contacts during fabrication of semiconductor devices as claimed in claim 1 wherein the first layer and the second layer are approximately 1000 Å thick and the third layer is approximately 10–20 Å thick.

7. A method of forming isolated metal contacts during fabrication of semiconductor devices comprising the steps of:

providing a mesa structure of a semiconductor device having an upper surface, a lower surface and an upright sidewall extending between the upper surface and the lower surface;

blanket forming III–V contact metal on the semiconductor device in a single step with a first layer overlying the upper surface, a second layer overlying the lower surface and a third layer overlying the sidewall, the third layer being substantially thinner than the first layer and the second layer; and blanket oxidizing the III–V contact metal until the third layer overlying the sidewall is substantially completely oxidized thereby electrically isolating the first layer from the second layer.

8. A method of forming isolated metal contacts during fabrication of semiconductor devices as claimed in claim 7 wherein the step of blanket forming III–V contact metal includes evaporation deposition.

9. A method of forming isolated metal contacts during fabrication of semiconductor devices as claimed in claim 7 wherein the step of blanket oxidizing includes exposing the III–V contact metal to deep ultra violet light in the presence of oxygen.

10. A method of forming isolated metal contacts during fabrication of semiconductor devices as claimed in claim 7 wherein the blanket material includes aluminum.

11. A method of forming isolated metal contacts during fabrication of semiconductor devices as claimed in claim 7 wherein the first layer and the second layer are approximately 1000 Å thick and the third layer is approximately 10–20 Å thick.

12. A method of forming isolated metal contacts during fabrication of semiconductor devices comprising the steps of:

providing a mesa structure of a semiconductor device having an upper surface, a lower surface and an upright sidewall extending between the upper surface and the lower surface;

blanket forming contact metal on the semiconductor device with a first layer approximately 1000 Å thick overlying the upper surface, a second layer approximately 1000 Å thick overlying the lower surface and a third layer approximately 10–20 Å thick overlying the sidewall; and blanket oxidizing the contact metal until the third layer overlying the sidewall is substantially completely oxidized thereby electrically isolating the first layer from the second layer.

13. A method of forming isolated metal contacts during fabrication of semiconductor devices as claimed in claim 12 wherein the step of blanket forming contact metal includes evaporation deposition.

14. A method of forming isolated metal contacts during fabrication of semiconductor devices as claimed in claim 12 wherein the step of blanket oxidizing includes exposing the contact metal to deep ultra violet light in the presence of oxygen.

15. A method of forming isolated metal contacts during fabrication of semiconductor devices as claimed in claim 12 wherein the contact element includes a III–V material.

16. A method of forming isolated metal contacts during fabrication of semiconductor devices as claimed in claim 15 wherein the blanket material includes aluminum.

* * * * *